US005229616A

United States Patent [19]
Hara

[11] Patent Number: 5,229,616
[45] Date of Patent: Jul. 20, 1993

[54] LAMP FOR ENVELOPING A SINGLE ISOTOPE OF A METAL ELEMENT AND EXPOSURE APPARATUS INCLUDING THE LAMP

[75] Inventor: Hideo Hara, Kanagawa, Japan

[73] Assignee: Hoya Corporation, Tokyo, Japan

[21] Appl. No.: 758,732

[22] Filed: Sep. 12, 1991

[51] Int. Cl.$^5$ ............................ G21G 4/00; H01J 37/00
[52] U.S. Cl. ................................. 250/493.1; 250/492.1; 313/639
[58] Field of Search ............. 250/493.1, 495.1, 504 R, 250/492.1; 313/638, 639; 372/56

[56] References Cited

U.S. PATENT DOCUMENTS

| | | | |
|---|---|---|---|
| 3,755,756 | 8/1973 | Silfvast ................................... | 372/56 |
| 4,379,252 | 4/1983 | Work et al. ........................... | 313/639 |
| 4,445,067 | 4/1984 | Inoue et al. .......................... | 313/639 |
| 4,607,371 | 8/1986 | Eden et al. ............................. | 372/56 |
| 4,625,120 | 11/1986 | Caprari ............................. | 250/492.1 |
| 4,707,609 | 11/1987 | Shimamura ....................... | 250/492.1 |
| 4,900,938 | 2/1990 | Suzuki et al. ..................... | 250/492.1 |
| 5,097,137 | 3/1992 | Ogoh ................................. | 250/492.1 |
| 5,099,557 | 3/1992 | Engelsberg ....................... | 250/492.1 |

Primary Examiner—Bruce C. Anderson
Attorney, Agent, or Firm—Ladas & Parry

[57] ABSTRACT

In an exposure light source for use in exposing a pattern onto a substrate, an exposure lamp substantially encloses only a single isotope of a specific metal. The single isotope emits far ultraviolet light which has a very narrow bandwidth when vaporized and excited in the exposure lamp. Preferably, the single isotope may have a nuclear spin equal to zero and is effective to make the bandwidth of the far ultraviolet light narrower. The single isotope may be determined in consideration of an abundance ratio of each isotope. The specific metal may be selected from a group consisting of mercury, lead, zinc, and cadmium.

20 Claims, 2 Drawing Sheets

LAMP FOR ENVELOPING A SINGLE ISOTOPE OF A METAL ELEMENT AND EXPOSURE APPARATUS INCLUDING THE LAMP

BACKGROUND OF THE INVENTION

This invention relates to a lamp which is operable as an exposure light source of an exposure apparatus.

An exposure apparatus of the type described is very often used in manufacturing a semiconductor device so as to project a mask pattern onto a semiconductor wafer and to expose the semiconductor wafer. To this end, the exposure apparatus comprises a lamp which is often called an exposure lamp and which is operable as an exposure light source in addition to an optical system which guides an optical beam from the lamp to the semiconductor wafer.

It is noted that the lamp has major influence on the size of each of the products, namely, semiconductor devices, as known in the art. Specifically, a minimum pattern size of the semiconductor devices is dependent on the wavelength of the optical beam emitted from the exposure light source.

Heretofore, a high pressure mercury lamp is used as such an exposure light source. In the high pressure mercury lamp, mercury which is enveloped in solid state form is vaporized and kept at a high pressure of several tens of atmospheres when it is excited by supply of an electric voltage. The high pressure mercury lamp can emit optical beams which have a spectrum distribution. The spectrum distribution includes spectra of specific wavelengths which are equal to 436 nm and 365 nm and which may be called g and i lines, respectively.

The g line is suitable for manufacturing a dynamic random access memory of 4 megabits which may be referred to as 4 MDRAM and which has a minimum pattern size of 0.8 micron meters while the i line is used for manufacturing a dynamic random access memory of 16 megabits which may be referred to as 16 MDRAM and which has a minimum pattern size of 0.5 to 0.6 micron meters.

Herein, it is mentioned that recent interest is mainly directed to a dynamic random access memory of 64 megabits which may be called a 64 MDRAM and which is considered as a very large scale integrated memory of the succeeding generation. In order to actually manufacture the 64 MDRAM, a line and space size, namely, a minimum pattern size should be equal to or smaller than 0.3 micron meter. This means that an exposure light source must emit a beam having an exposure wavelength of 250 nm or so within a far ultraviolet waveband.

As a conventional exposure light source for emitting far ultraviolet light, an excimer laser of krypton-fluoride (KrF) has been known which emits a laser wavelength of 248 nm.

It is mentioned here that the far ultraviolet light is projected onto a semiconductor wafer through an optical lens system of a reduction projection type. In such an optical lens system, use must be made of a lens material which exhibits a low absorptivity for the far ultraviolet light. The lens material may be, for example, fluorspar ($CaF_2$) or quartz.

However, fluorspar has difficulty as regards precise processing and temperature control. Under the circumstances, only synthetic quartz is practically used as the lens material of the optical lens system for the exposure light source. This shows that each lens of the optical lens system must be formed by a single material, namely, quartz which has an identical refraction coefficient. In general, an achromatic lens is formed by a combination of lenses which have different refraction coefficients. Therefore, the above-mentioned optical lens system in question can not include an achromatic lens or lenses and is structured as a monochromatic lens system.

It is to be noted that quartz has a very large dispersion within the far ultraviolet region. Therefore, a spectrum bandwidth of an exposure wavelength must be adjusted in the optical lens system so that a half band width becomes equal to or less than 0.003 nm.

When the excimer laser is used as the exposure light source to emit an optical beam, the optical beam emitted from a excimer laser has the spectrum bandwidth which is as wide as 0.3 nm. Such a wide spectrum bandwidth should be narrowed in some way so as to send the optical beam to the semiconductor wafer through the optical lens system, as mentioned above, and to expose the semiconductor wafer to the optical beam. Even if the optical beam has a narrow bandwidth, speckles are liable to occur on the semiconductor wafer, which makes it difficult to obtain a line and space of 0.3 micron meters.

In addition, a halogen gas is inevitably used as a laser gas in the excimer laser. This necessitates large supplementary equipment for handling the halogen gas and evacuating it. Furthermore, running costs are very high as well as manufacturing costs.

SUMMARY OF THE INVENTION

It is an object of this invention to provide an exposure light source which is suitable for manufacturing a very large scale integrated memory without large-scale supplementary equipment.

It is another object of this invention to provide an exposure light source of the type described, which is capable of producing a line and space necessary for the very large scale integrated memory.

It is still another object of this invention to provide an exposure lamp which is capable of obtaining the high resolution necessary for a very large scale integrated memory without any supplementary equipment.

It is yet another object of this invention to provide an exposure lamp of the type described which is comparatively inexpensive.

According to this invention, a lamp is used in emitting far ultraviolet light to illuminate a substrate. The lamp envelopes a metal element which substantially consists of a single isotope such that the far ultraviolet light is emitted on vaporization of the single isotope.

DESCRIPTION OF THE PREFERRED EMBODIMENTS

Figure 1:
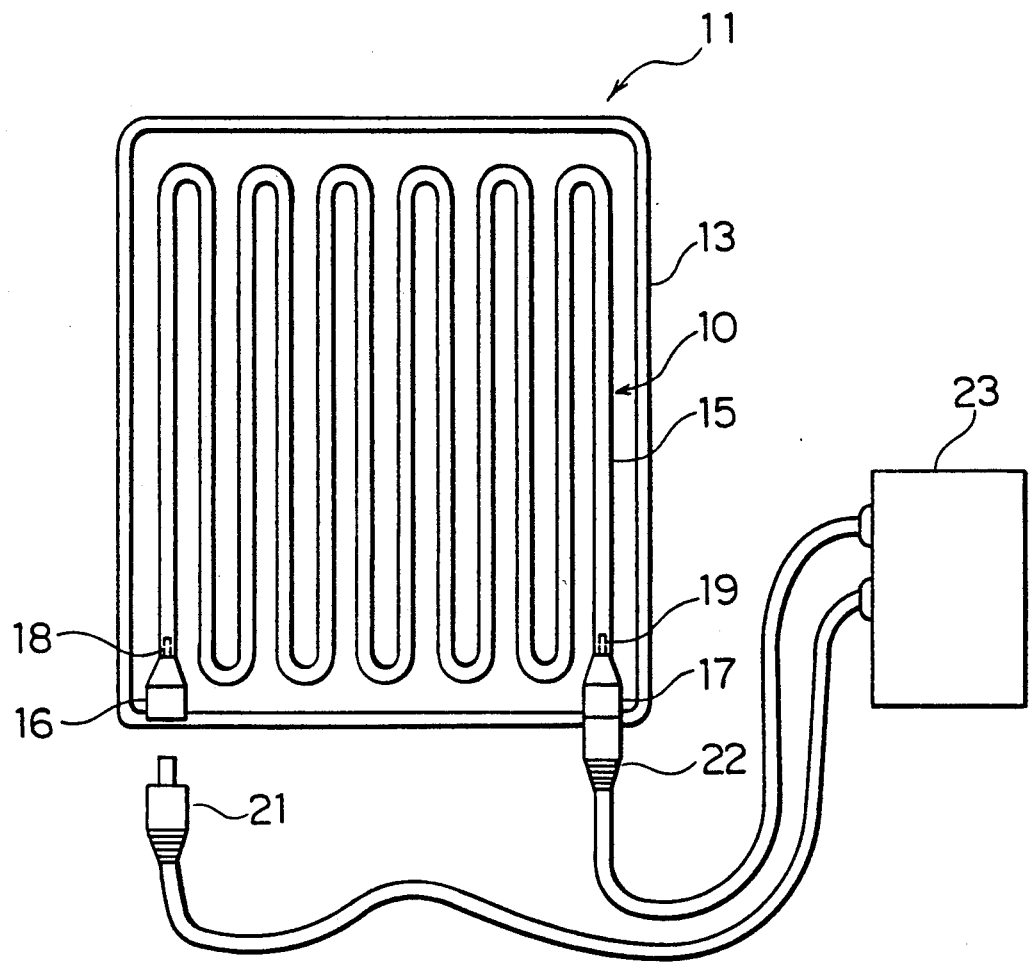
FIG. 1 is a schematic view of an illuminator which includes an exposure light source according to an embodiment of this invention.
Figure 2:
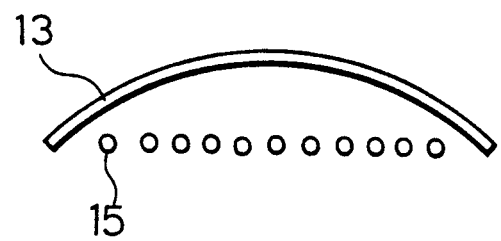
FIG. 2 is a sectional view of the exposure light source illustrated in FIG. 1.

Referring to FIGS. 1 and 2, an exposure light source 10 according to a first embodiment of this invention is included in an illuminator 11 which comprises a reflection mirror 13 at the rear of the exposure light source 10 with a spacing left between the reflection mirror 13 and the exposure light source 10. The reflection mirror 13 may have a half elliptic configuration (as shown in FIG. 2), a half spherical configuration, a half circular configuration, or the like in cross section and it partially surrounds the exposure light source 10, as illustrated in FIG. 2. At any rate, the reflection mirror 13 is operable to converge the light beam emitted from the exposure light source 10 onto a semiconductor wafer (not shown in this figure).

In FIG. 1, the illustrated exposure light source 10 comprises an exposure lamp 15 which further comprises a lamp tube, first and second connectors 16 and 17, and first and second electrodes 18 and 19. The lamp tube has first and second open end portions and an intermediate portion of a meandering configuration between the first and the second end portions. The intermediate portion of the lamp tube is composed of straight portions and curved portions, as illustrated in FIG. 1. The lamp tube is formed of quartz and may therefore be called a quartz discharge tube. The first and the second connectors 16 and 17 are hermetically or airtightly fitted to the first and the second end portions. The first and the second electrodes 18 and 19 are inserted into an internal space of the lamp tube through the first and the second connectors 16 and 17, respectively. Although not shown in FIG. 1, a vaporizable metal is enclosed within the internal space of the lamp tube, as will be described later in detail. The electrical discharge between the first and the second electrodes 18 and 19 serve to heat and vaporize the vaporizable metal in the internal space of the lamp tube.

In order to enclose the vaporizable metal within the internal space, the lamp tube is first evacuated by a vacuum pump (not shown) and the vaporizable metal is thereafter introduced within the internal space of the lamp tube together with inert gas, such as an argon neon, or the like. In this event, the amount of the vaporizable metal is selected so that a partial pressure of the vaporizable metal is lower than 1 atmosphere when the vaporizable metal is vaporized within the internal space of the lamp tube. Specifically, the partial pressure of the vaporizable metal may be as low as several Torrs. In this connection, the exposure lamp 15 may be referred to as a low pressure lamp. Subsequently, the first and the second connectors 16 and 17 are airtightly fitted to the first and the second end portions of the lamp tube.

Moreover, the illustrated illuminator 11 further comprises a pair of source terminals 21 and 22 connected to the first and the second connectors 16 and 17 and to a power source 23. With this structure, it is possible to emit light rays from the exposure light source 10 when an electric voltage is impressed between the source terminals 21 and 22 with the source terminals 21 and 22 electrically connected to the first and the second connectors 16 and 17 in a manner to be described later in detail.

It is mentioned here that each element is given an atomic number and the mass number equal to a sum of the numbers of protons and neutrons. When a plurality of isotopes having different mass numbers, are used a spread of an emission spectrum depends on the number of the isotopes of the element because such isotopes which have different mass numbers cause an isotope shift to occur. In other words, such an isotope shift results from subtle displacements of emission spectra of isotopes having different mass numbers and spreads a bandwidth of each emission spectrum.

Now, the vaporizable metal may be, for example, mercury, and substantially consists of a single isotope of the mercury. Herein, it is known that mercury has, in nature, seven stable isotopes which are specified by $_{80}Hg^{196}$, $_{80}Hg^{198}$, $_{80}Hg^{199}$, $_{80}Hg^{200}$, $_{80}Hg^{201}$, $_{80}Hg^{202}$, and $_{80}Hg^{204}$. In the example being illustrated, one of the seven isotopes is selected and enclosed in the lamp tube. Herein, Table 1 shows a nuclear spin and an abundance ratio of each isotope. The nuclear spin may be replaced by a nuclear magnetic moment.

TABLE 1

| isotopes | nuclear spin | abundance ratio (%) |
|---|---|---|
| $_{80}Hg^{196}$ | 0 | 0.15 |
| $_{80}Hg^{198}$ | 0 | 10.0 |
| $_{80}Hg^{199}$ | not 0 | 16.8 |
| $_{80}Hg^{200}$ | 0 | 23.1 |
| $_{80}Hg^{201}$ | not 0 | 13.2 |
| $_{80}Hg^{202}$ | 0 | 29.8 |
| $_{80}Hg^{204}$ | 0 | 6.9 |

In general, isotopes are readily obtained with an increase of the abundance ratio. Taking this into consideration, a selected one of the isotopes may be selected from a specific isotope group of $_{80}Hg^{199}$, $_{80}Hg^{200}$, and $_{80}Hg^{202}$ as the single isotope of the mercury.

The selected isotope of the mercury is excited and vaporized into metal vapor in the lamp tube by supplying an electric voltage of, for example, an a.c. voltage of 10 kilovolts from the power source 25 across the first and the second connectors 16 and 17. If $_{80}Hg^{199}$ is selected as the selected isotope, light rays are emitted from the exposure lamp 15 having a pair of emission spectra which are subtly split from each other with a wavelength distance of 0.005 nm therebetween and which fall within a wavelength band of 253.7 nm. At any rate, the light rays are ultraviolet in the far region. Herein, such split emission spectra appear on the basis of the nuclear spin, as will become clear as the description proceeds, and may be called a hyper fine line structure. In other words, use of $_{80}Hg^{199}$ brings about the hyper fine line structure. From this fact, it is apparent that the emission spectra are determined in dependence upon the single isotope of the mercury.

With this structure, it is possible to prevent the emission spectra from being spread over a bandwidth of 0.005 nm. This is because only the single isotope of the mercury is enclosed within the lamp tube and can avoid a nuclear shift which occurs from coexistence of a plurality of isotopes of the mercury. Therefore, the light rays exhibits a very narrow emission spectrum when the single isotope is enclosed within the lamp tube even when $_{80}Hg^{199}$ is used as the single isotope, although the emission spectrum shows the hyper fine line structure. This exposure lamp can be used as an exposure lamp source for manufacturing 16 MDRAM, although the exposure lamp can not be suitable for an exposure lamp source of 64 MDRAM.

Alternatively, assume either $_{80}Hg^{200}$ or $_{80}Hg^{202}$ is selected as the single or selected isotope. As tabulated in Table 1, the selected isotope, such as $_{80}Hg^{200}$ or $_{80}Hg^{202}$, has a nuclear spin equal to 0. When either $_{80}Hg^{200}$ or $_{80}Hg^{202}$ is enclosed in the lamp tube, it is also possible to avoid occurrence of the hyper fine line structure which appears when a single isotope has a nuclear spin which is not equal to 0, as mentioned before. Practically, $_{80}Hg^{200}$ is selected as the single or selected isotope and enclosed in the lamp tube in consideration of the abundance ratio of $_{80}Hg^{200}$. When the lamp tube has a length equal to 1 meter, several tens of milligrams of $_{80}Hg^{200}$ are enclosed in the lamp tube. In this case, the selected isotope $_{80}Hg^{200}$ can emit an optical beam when vaporized and excited. The optical beam has a single emission spectrum which has a wavelength of 253.7 nm and a spectrum bandwidth narrower than 0.002 nm. This shows that the optical beam has a wavelength of a far ultraviolet band and the spectrum bandwidth is very narrow without a spread of the spectrum based on the isotope shift and without the hyper fine line structure. An isotope, such as $_{80}Hg^{200}$, is produced and sold by Nippon Sanso Corporation (Tokyo, Japan) and can be readily obtained for use in the exposure lamp 15.

Figure 3:
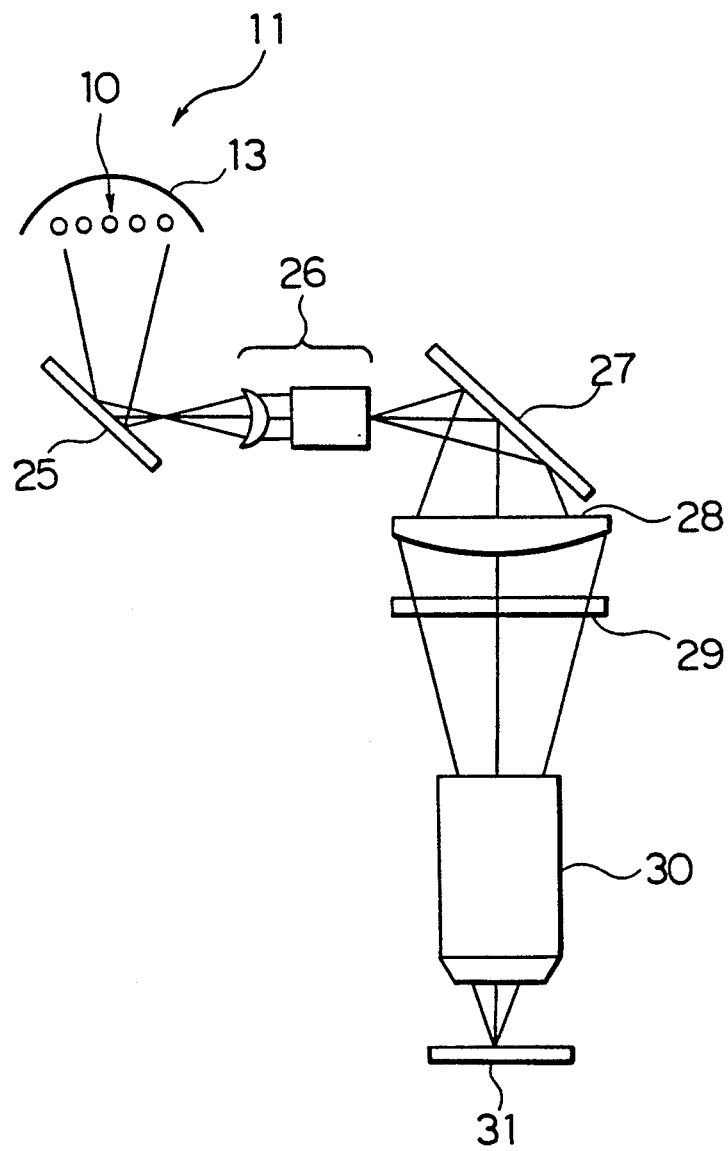
FIG. 3 is a schematic view of an exposure apparatus which includes the exposure light source illustrated in FIGS. 1 and 2.

Referring to FIG. 3, an exposure apparatus comprises the illuminator 11 which is illustrated in FIGS. 1 and 2 and which is symbolized by the reflection mirror 13 and the exposure light source 10. The illuminator 11 emits, from the exposure light source 10, the far ultraviolet light which has the narrow bandwidth, as mentioned in conjunction with FIG. 1. The far ultraviolet light is reflected by a mirror 25 and thereafter sent through an optical integrator 26 to an additional mirror 27 as reflected far ultraviolet light. The reflected far ultraviolet light is projected through a condenser lens 28 onto a photomask 29 on which an enlarged circuit pattern is delineated. An image of the enlarged circuit pattern is passed to a reduction projection lens 30 to be sent to a semiconductor wafer 31 as a reduced image pattern. The semiconductor wafer 31 may be a wafer of silicon, GaAs, or the like. Thus, the enlarged circuit pattern on the photomask 30 is transcribed onto the semiconductor wafer 30 in the form of a reduced circuit pattern. The optical integrator 26, the condenser lens 28, and the lens 30 may be composed of quartz.

Thus, only the single isotope of the mercury is enclosed within the exposure lamp 15. This enables prevention of occurrence of the isotope shift and produces a narrow spectrum bandwidth. Furthermore, when a isotope which has the nuclear spin equal to zero is enveloped within the lamp tube, it is possible to avoid occurrence of the hyper fine line structure. This makes it possible to make the spectrum bandwidth narrower. Therefore, when such an exposure light source is applied to an exposure apparatus for manufacturing a semiconductor device, it is possible to manufacture a very large scale integrated memory, such as a 64 MDRAM, without using any supplementary equipment, which differs from conventional exposure apparatus comprising the excimer laser. This means that the exposure light source according to this invention can accomplish the line and space which is necessary for the 64 MDRAM and is inexpensive in comparison with the conventional exposure apparatus.

In the above-mentioned embodiment, mercury alone is used as the vaporizable metal. However, such a vaporizable metal is not restricted to mercury but may be, for example, lead, cadmium, or zinc. An element, such as lead, cadmium, or zinc, also enables emission of a far ultraviolet region like mercury. When the above-enumerated elements are used as the selected metal, the exposure lamp 15 is formed as a hollow cathode lamp which has a cathode and anode instead of the first and the second electrodes 18 and 19 illustrated in FIG. 1. In addition, the cathode may be composed of the selected metal. Tables 2, 3, and 4 show isotopes, nuclear spins, abundance ratios of lead (Pb), zinc (Zn), and cadmium (Cd), respectively. As known in the art, lead (Pb), zinc (Zn), and cadmium (Cd) have four, five, and eight isotopes, as tabulated in Tables 2, 3, and 4, respectively.

TABLE 2

| isotopes | nuclear spin | abundance ratio (%) |
|---|---|---|
| $_{82}Pb^{204}$ | 0 | 1.4 |
| $_{82}Pb^{206}$ | 0 | 24.1 |
| $_{82}Pb^{207}$ | not 0 | 22.1 |
| $_{82}Pb^{208}$ | 0 | 52.4 |

TABLE 3

| isotopes | nuclear spin | abundance ratio (%) |
|---|---|---|
| $_{30}Zn^{64}$ | 0 | 48.6 |
| $_{30}Zn^{66}$ | 0 | 27.9 |
| $_{30}Zn^{67}$ | not 0 | 4.1 |
| $_{30}Zn^{68}$ | 0 | 18.8 |
| $_{30}Zn^{70}$ | 0 | 0.6 |

TABLE 4

| isotopes | nuclear spin | abundance ratio (%) |
|---|---|---|
| $_{48}Cd^{106}$ | 0 | 1.25 |
| $_{48}Cd^{108}$ | 0 | 0.89 |
| $_{48}Cd^{110}$ | 0 | 12.49 |
| $_{48}Cd^{111}$ | not 0 | 12.80 |
| $_{48}Cd^{112}$ | 0 | 24.13 |
| $_{48}Cd^{113}$ | not 0 | 12.22 |
| $_{48}Cd^{114}$ | 0 | 28.73 |
| $_{48}Cd^{116}$ | 0 | 7.49 |

Practically, the metal may be selected from the enumerated isotopes of Pb, Zn, and Cd in consideration of the abundance ratio of the isotopes, as mentioned in conjunction with mercury.

In the illustrated example, the exposure apparatus is used for transcribing the circuit pattern onto the semiconductor wafer. The semiconductor wafer may be replaced either by a photomask blank having a shading layer of chromium or the like coated on a glass substrate or by a photoluminescent panel having a transparent film of indium-tin-oxide or the like coated on a glass substrate.

At any rate, a single isotope of a specific metal element is enveloped within a lamp tube and vaporized into metal vapor to emit far ultraviolet light. Thus, it is possible to remove an isotope shift by enveloping the single isotope and to thereby reduce a spectrum bandwidth. Such a reduction of the spectrum bandwidth is helpful in the manufacture of a very large scale integrated memory, such as 4 MDRAM, 16 MDRAM, or the like, although a hyper fine line structure may appear in a spectrum in dependence upon a nuclear spin of the selected isotope.

In addition, when selection is made of an isotope which has a nuclear spin equal to zero, the hyper fine line structure can also be removed together with the isotope shift. Therefore, selection of such an isotope is effective for making the spectrum bandwidth narrow.

From this fact, it is readily understood that the desired line and space necessary for a very large scale integrated memory can be accomplished by merely selecting the isotope to be enclosed within the exposure lamp. This dispenses with any supplementary equipment and makes the exposure apparatus inexpensive.

While this invention has thus far been described in conjunction with several embodiments thereof, it will readily be possible for those skilled in the art to put this invention into practice in various other ways. For example, the exposure lamp may have a wide variety of configurations in lieu of the meandering configuration, as illustrated in FIG. 1. In addition, the exposure lamp may be a microwave excitation lamp. Various kinds of isotopes may be used to emit far ultraviolet light.

What is claimed is:

1. An exposure lamp for emitting incoherent far ultraviolet light to illuminate a substrate, said lamp enveloping a metal element which substantially consists of a single isotope of said metal element such that said incoherent far ultraviolet light is emitted on vaporization of said single isotope.

2. A lamp as claimed in claim 1, wherein said single isotope has a nuclear spin equal to zero.

3. A lamp as claimed in claim 1, wherein said metal element is an element selected from the group consisting of mercury (Hg), cadmium (Cd), zinc (Zn), and lead (Pb).

4. A lamp as claimed in claim 1, wherein said metal element is mercury and said single isotope is $_{80}Hg^{196}$, $_{80}Hg^{198}$, $_{80}Hg^{199}$, $_{80}Hg^{200}$, $_{80}Hg^{201}$, $_{80}Hg^{202}$, or $_{80}Hg^{204}$.

5. A lamp as claimed in claim 1, wherein said metal element is lead and said single isotope is $_{82}Pb^{204}$, $_{82}Pb^{206}$, $_{82}Pb^{207}$, or $_{82}Pb^{208}$.

6. A lamp as claimed in claim 1, wherein said metal element is zinc and said single isotope is $_{30}Zn^{64}$, $_{30}Zn^{66}$, $_{30}Zn^{67}$, $_{30}Zn^{68}$, or $_{30}Zn^{70}$.

7. A lamp as claimed in claim 1, wherein said metal element is cadmium and said single isotope is $_{48}Cd^{106}$, $_{48}Cd^{108}$, $_{48}Cd^{110}$, $_{48}Cd^{111}$, $_{48}Cd^{112}$, $_{48}Cd^{113}$, $_{48}Cd^{114}$, or $_{48}Cd^{116}$.

8. A lamp as claimed in claim 1, wherein said single isotope produces a light beam of said far ultraviolet light in a narrow bandwidth of less than 0.005 nm.

9. A lamp as claimed in claim 8, wherein said light beam produced by said single isotope has a wavelength of about 250 nm.

10. A lamp as claimed in claim 9, wherein said narrow bandwith and said wavelength of said light beam produced by said single isotope are effective when said lamp is utilized in combination in an exposure apparatus to illuminate a substrate for producing minimum pattern sizes of no more than 0.3 micron meters on said substrate.

11. A lamp as claimed in claim 1 further comprising means for receiving said far ultraviolet light as a beam of incoherent light and projecting said beam onto said substrate.

12. An exposure apparatus for use in exposing a substrate to manufacture a semiconductor device, said exposure apparatus comprising an exposure light source for emitting incoherent far ultraviolet light onto said substrate, said exposure light source comprising:

a lamp enveloping a metal element which substantially consists of a single isotope such that said incoherent far ultraviolet light is emitted on vaporization of said single isotope.

13. An exposure apparatus as claimed in claim 12, wherein said single isotope has a nuclear spin equal to zero.

14. An exposure apparatus as claimed in claim 12, wherein said metal element is selected from the group consisting of mercury (Hg), lead (Pb), zinc (Zn), and cadmium (Cd).

15. An exposure apparatus as claimed in claim 12, wherein said metal element is mercury and said single isotope is $_{80}Hg^{196}$, $_{80}Hg^{198}$, $_{80}Hg^{199}$, $_{80}Hg^{200}$, $_{80}Hg^{201}$, $_{80}Hg^{202}$, or $_{80}Hg^{204}$.

16. An exposure apparatus as claimed in claim 12, wherein said metal element is lead and said single isotope is $_{82}Pb^{204}$, $_{82}Pb^{206}$, $_{82}Pb^{207}$, or $_{82}Pb^{208}$.

17. An exposure apparatus as claimed in claim 12, wherein said metal element is zinc and said single isotope is $_{30}Zn^{64}$, $_{30}Zn^{66}$, $_{30}Zn^{67}$, $_{30}Zn^{68}$, or $_{30}Zn^{70}$.

18. An exposure apparatus as claimed in claim 12, wherein said metal element is cadmium and said single isotope is $_{48}Cd^{106}$, $_{48}Cd^{108}$, $_{48}Cd^{110}$, $_{48}Cd^{111}$, $_{48}Cd^{112}$, $_{48}Cd^{113}$, $_{48}Cd^{114}$, or $_{48}Cd^{116}$.

19. An exposure apparatus as claimed in claim 12, further comprising optical means for receiving said far ultraviolet light from said light source as a beam of incoherent light and projection said beam onto said substrate.

20. A method of emitting far ultraviolet light from an exposure lamp to illuminate a substrate, said method comprising exciting an exposure lamp to vaporize a metal element in said lamp and produce a beam of incoherent far ultraviolet light, and selecting as said metal element a single isotope of said metal element so that said beam of incoherent far ultraviolet light has a wavelength of about 250 nm and a narrow bandwidth of less than 0.005 nm.

* * * * *